(12) United States Patent
Korich et al.

(10) Patent No.: US 9,295,184 B2
(45) Date of Patent: Mar. 22, 2016

(54) SCALABLE AND MODULAR APPROACH FOR POWER ELECTRONIC BUILDING BLOCK DESIGN IN AUTOMOTIVE APPLICATIONS

(71) Applicant: GM GLOBAL TECHNOLOGY OPERATIONS LLC, Detroit, MI (US)

(72) Inventors: Mark D. Korich, Chino Hills, CA (US); Vicentiu Grosu, San Pedro, CA (US); David Tang, Rancho Cucamonga, CA (US); Gregory S. Smith, Woodland Hills, CA (US); Konstantinos Triantos, Huntington Beach, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 170 days.

(21) Appl. No.: 14/094,066

(22) Filed: Dec. 2, 2013

(65) Prior Publication Data
US 2014/0168900 A1    Jun. 19, 2014

Related U.S. Application Data

(60) Provisional application No. 61/737,652, filed on Dec. 14, 2012.

(51) Int. Cl.
*H05K 5/00* (2006.01)
*H05K 7/00* (2006.01)
(Continued)

(52) U.S. Cl.
CPC .............. *H05K 7/209* (2013.01); *H05K 7/1432* (2013.01); *Y10T 29/49117* (2015.01)

(58) Field of Classification Search
CPC .... Y10T 29/49117; H05K 7/02; H05K 7/209; H05K 13/0023; H05K 7/1432
USPC ............ 361/679.01, 611, 624, 632, 688–723; 363/13–147; 29/825
See application file for complete search history.

(56) References Cited

U.S. PATENT DOCUMENTS

| 2005/0162875 A1 * | 7/2005 | Rodriguez et al. .............. 363/68 |
| 2006/0120001 A1 | 6/2006 | Weber et al. |

(Continued)

FOREIGN PATENT DOCUMENTS

| CN | 201608630 U | 10/2010 |
| CN | 202026250 U | 11/2011 |

(Continued)

OTHER PUBLICATIONS

The German Patent and Trade Mark Office, Office Action for German Patent Application No. 10 2013 225 627.2, mailed Jun. 16, 2014.

(Continued)

*Primary Examiner* — Anthony Haughton
*Assistant Examiner* — Yahya Ahmad
(74) *Attorney, Agent, or Firm* — Ingrassia Fisher & Lorenz, P.C.

(57) ABSTRACT

A power electronic building block includes a housing; a power module mounted within the housing; a controller mounted within the housing and coupled to the power module; a capacitor assembly coupled to the power module and mounted within the housing; an AC bus bar mounted within the housing; and a DC bus bar coupling the capacitor assembly to the power module and mounted within the housing.

16 Claims, 10 Drawing Sheets

(51) Int. Cl.
*H05K 7/20* (2006.01)
*H05K 7/14* (2006.01)

(56) References Cited

U.S. PATENT DOCUMENTS

| | | | |
|---|---|---|---|
| 2010/0025126 A1* | 2/2010 | Nakatsu et al. | 180/65.1 |
| 2010/0157640 A1* | 6/2010 | Azuma et al. | 363/132 |
| 2010/0302737 A1* | 12/2010 | Yankoski et al. | 361/709 |
| 2011/0017808 A1* | 1/2011 | Eisele et al. | 228/173.1 |
| 2011/0188279 A1* | 8/2011 | Aiba et al. | 363/141 |
| 2012/0250384 A1* | 10/2012 | Ito et al. | 363/132 |

FOREIGN PATENT DOCUMENTS

| | | |
|---|---|---|
| DE | 102011000706 A1 | 3/2012 |
| JP | 2007089259 A | 4/2007 |
| JP | 2008148530 A | 6/2008 |

OTHER PUBLICATIONS

State Intellectual Property Office of the People's Republic of China, Office Action for Chinese Patent Application No. 201310757419.7 mailed Oct. 28, 2015.

* cited by examiner

SCALABLE AND MODULAR APPROACH FOR POWER ELECTRONIC BUILDING BLOCK DESIGN IN AUTOMOTIVE APPLICATIONS

PRIORITY CLAIM

This application claims the benefit of U.S. Provisional Application No. 61/737,652 filed Dec. 14, 2012.

BACKGROUND

In recent years, advances in technology have led to substantial changes in the design of automobiles. One of the changes involves the complexity of the electrical systems within automobiles, particularly alternative fuel vehicles, such as hybrid, electric, and fuel cell vehicles. Such alternative fuel vehicles typically use one or more electric motors, perhaps in combination with another actuator, to drive the wheels. Additionally, such automobiles may also include other motors, as well as other high voltage components, to operate the other various systems within the automobile, such as the air conditioner.

Due to the fact that alternative fuel automobiles typically include only direct current (DC) power supplies, direct current-to-alternating current (DC/AC) inverters (or power inverters) are provided to convert the DC power to alternating current (AC) power, which is generally required by the motors. Such vehicles, particularly fuel cell vehicles, also often use two separate voltage sources, such as a battery and a fuel cell, to power the electric motors that drive the wheels. Thus, power converters are typically also provided to manage and transfer the power from the two voltage sources.

It is desirable to provide power converters and other electronic components with improved performance, as well as layouts and configurations that improve scalability and modularity in view of multiple applications. Furthermore, other desirable features and characteristics of the present invention will become apparent from the subsequent detailed description and the appended claims, taken in conjunction with the accompanying drawings and the foregoing technical field and background.

DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding technical field, background, brief summary or the following detailed description.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Further, various components and features described herein may be referred to using particular numerical descriptors, such as first, second, third, etc., as well as positional and/or angular descriptors, such as horizontal and vertical. However, such descriptors may be used solely for descriptive purposes relating to drawings and should not be construed as limiting, as the various components may be rearranged in other embodiments. It should also be understood that FIGS. 1-11 are merely illustrative and may not be drawn to scale.

Figure 1:
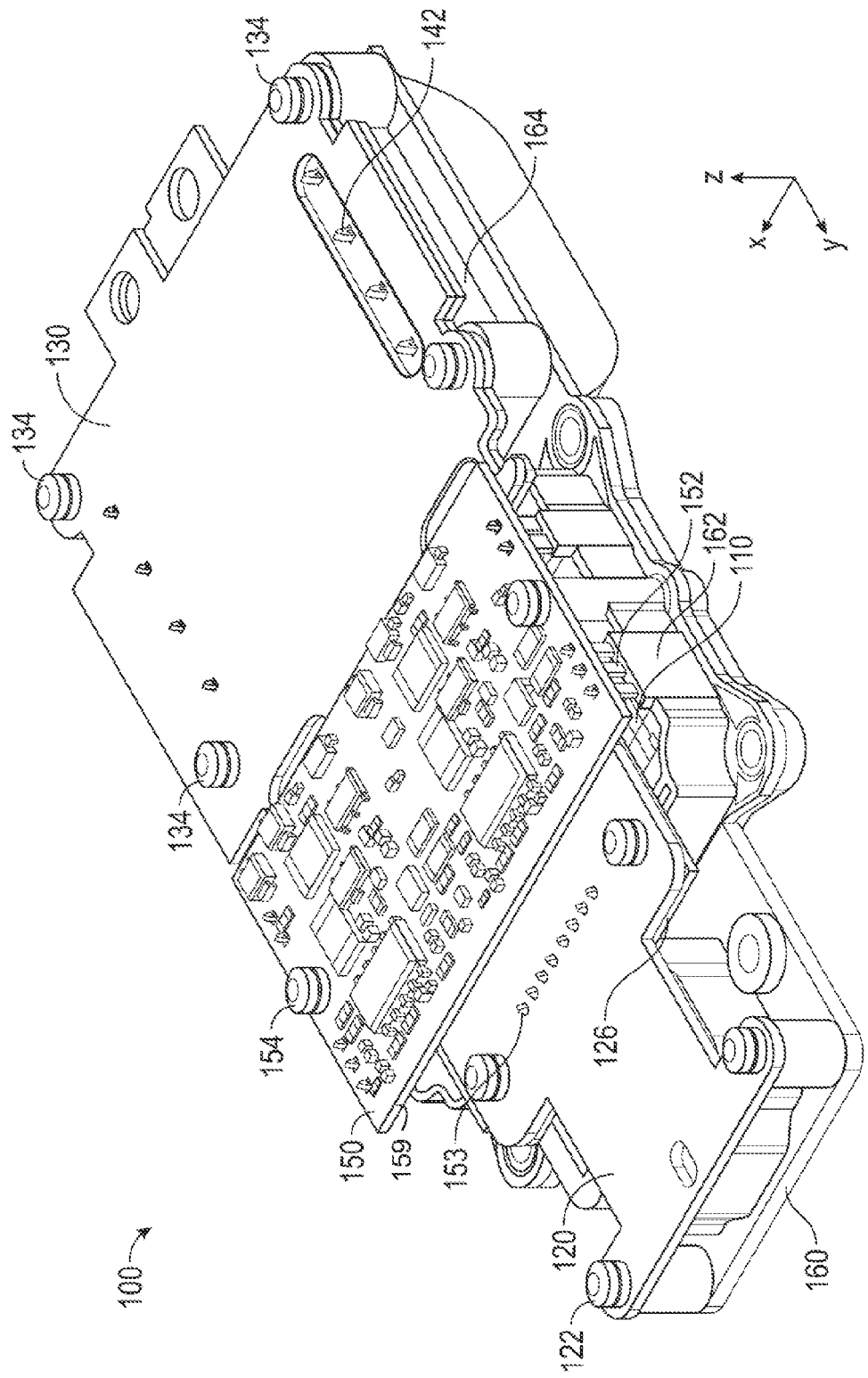
FIG. 1 is an isometric view of a power electronic building block in accordance with an embodiment.
Figure 2:
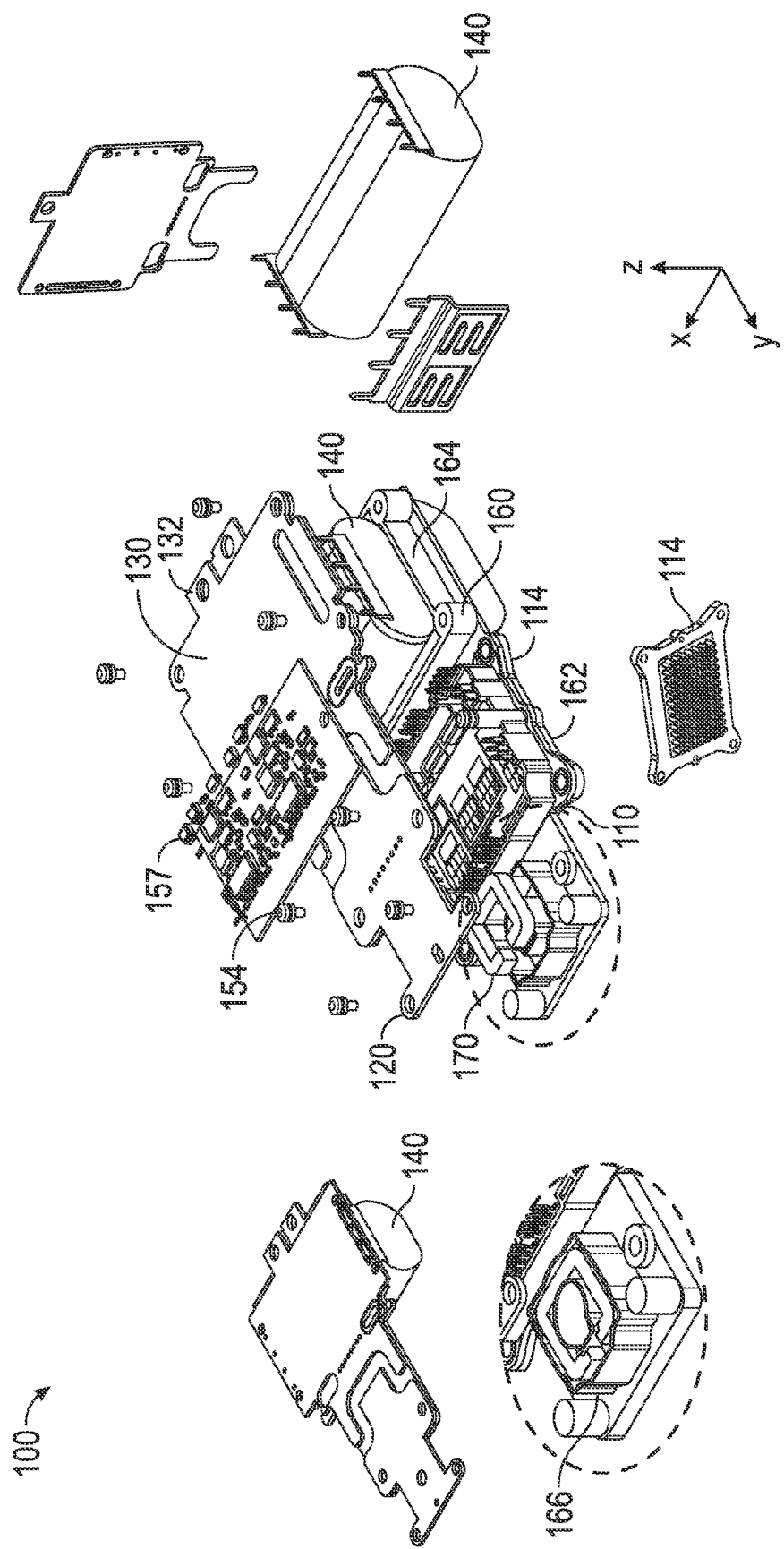
FIG. 2 is a partially exploded isometric view of the power electronic building block of FIG. 1 in accordance with an exemplary embodiment.

FIG. 1 is an isometric view of a power electronic building block (or assembly) 100 in accordance with an embodiment, and FIG. 2 is a partially exploded isometric view of the power electronic building block 100 with some of the components shown in greater detail in accordance with an exemplary embodiment. FIGS. 1 and 2 will be discussed together. The three-dimensional (x-y-z) reference coordinates shown in FIGS. 1 and 2 are used for illustrative purposes and for ease of description. As described in greater detail below, one or more the power electronic building blocks 100 may be incorporated into an inverter system, such as an inverter system for an automobile application.

As shown, the power electronic building block 100 includes a power module 110, an AC bus bar 120, a DC bus bar 130, a capacitor assembly 140, a controller 150, a housing 160, and a current sensor 170. In one exemplary embodiment, the components are integrated into a single package to be incorporated into a power system, either alone or in combination with additional power building blocks.

The power module 110 is incorporated into the housing 160, as shown. In one exemplary embodiment, power module 110 may be an inverter formed by a switch network having a first input coupled to a voltage source and an output coupled to a motor, as an example. The switch network may include pairs of series switches with antiparallel diodes and may be in the form of individual semiconductor devices such as insulated gate bipolar transistors (IGBTs) within integrated circuits formed on semiconductor (e.g. silicon) substrates (e.g., die). In one exemplary embodiment, the substrate of the power module 110 may be ceramic, e.g., a direct-bonded aluminum (DBA) substrate, a direct-bonded copper (DBC) substrate, and/or an active metal brazing (AMB) substrate selected based on the application, thereby providing a flexible solution. The power module 110 may include silicon or wide band die. The power module 110 may be mounted to the housing 160 in any suitable manner, including, for example, press-fit techniques. As shown, the power module 110 may be housed within a section 162 of the housing 160. For example, the section 162 may be formed by interior walls that are shaped to accommodate the power module 110.

Figure 3:
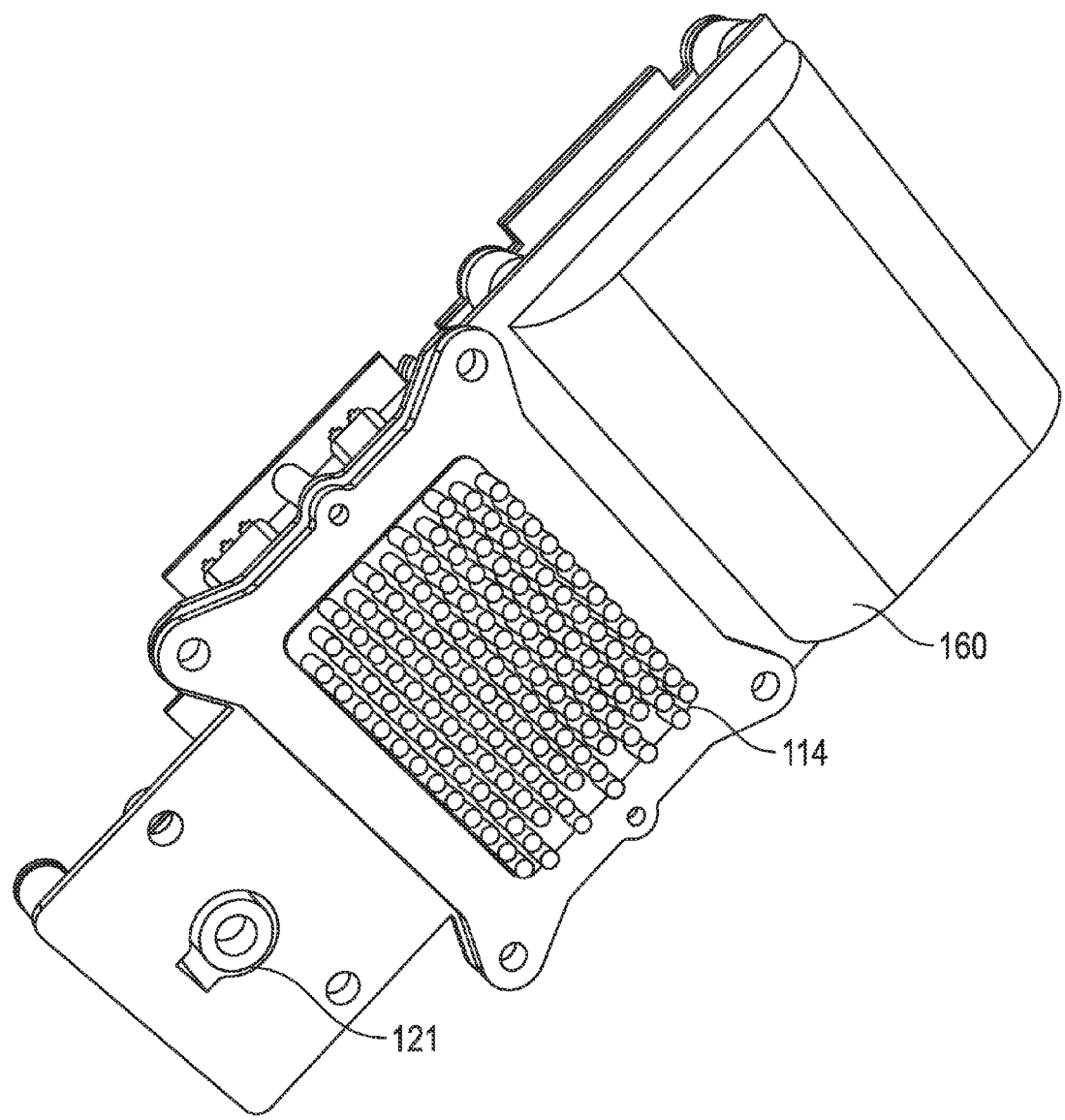
FIG. 3 is an isometric view of the power electronic building block of FIG. 1 in accordance with an exemplary embodiment.

The power module 110 may be coupled to a heat sink 114 to remove heat generated by the power module 110. As such, the heat sink 114 may be mounted on the underside of the power module 110 to provide a thermal pathway away from the electronic components. The heat sink 114 may include a number of pins or fins to facilitate heat removal. The heat sink 114 may be mounted in the housing 160 such that the pins or fins are exposed for heat removal, as shown in FIG. 3, which is an isometric view of the underside of the power module 110. In one exemplary embodiment, the housing 160 may include an opening to accommodate the heat sink 114 and mounted on the housing 160 with screws or other fasteners. The integrated heat sink may be manufactured from any suitable material, such as Al, Cu, and/or AlCu cladding.

As also noted above, AC bus bar 120 is incorporated into the power electronic building block 100 and couples together the various electronic components. As described in greater detail below, the AC bus bar 120 brings the AC current out of the power module 110 and eventually passes it through the current sensor 170 and to the motor connector 121, as shown in FIG. 3. The AC bus bar 120 may provide a direct motor connection for the power electronic building block 100. Similarly, the DC bus bar 130 is incorporated into the power electronic building block 100 and couples together the various electronic components, including the capacitor assembly 140 and the power module 110. The DC bus bar 130 may include one or more terminals 132.

The bus bars 120, 130 may be formed from a suitable material having the desired electrical and thermal conductivity, such as copper, aluminum, an alloy thereof, or the like. As shown, the bus bars 120, 130 are relative flat or planar to provide the electrical connections between components while being integrated into the power electronic building block 100.

The capacitor assembly 140 is incorporated into the power electronic building block 100, as shown. In one exemplary embodiment, the capacitor assembly 140 is positioned within a section 164 of the housing 160. For example, the section 164 may be formed by interior walls that are shaped to accommodate the housing of the capacitor assembly 140. In general, the capacitor assembly 140 may include a set, or sets, of conductive plates, in a spaced relationship and wound into coils (e.g., as a bobbin) to form a capacitor, or multiple capacitors, as in commonly understood. As described below, the capacitance of the capacitor assembly 140 may be increased by increasing the width of the bobbin, e.g., in the x direction, or by decreasing the film thickness. The capacitor assembly 140 may be a bulk capacitor.

The controller 150 is incorporated into the power electronic building block 100, as shown. The controller 150 may be formed by a substrate 159 and various electronic components 157 mounted thereon. In this exemplary embodiment, the controller 150 is mounted to the housing 160 with screws or other fasteners extending through the substrate 159. The controller 150 may be an integrated gate drive with optimized ASIC for increased processing capabilities. The controller 150 may be coupled to the power module 110 with press-fit techniques. During operation, the controller 150 may provide inputs to the power module 110 to operate the switches of the power module 110 to produce the desired voltage waveform for operating the motor or load.

The power electronic building block 100 may further include a hall effect current sensor 170 arranged in the housing 160. This arrangement provides an integrated current sensor within the power electronic building block 100. The current sensor 170 may be press-fit into the housing 160. As shown, the current sensor 170 may be housed within a section 166 of the housing 160. For example, the section 166 may be formed by interior walls that are shaped to accommodate the current sensor 170.

During operation, as current flows from the power module 110 to the motor, the current may pass through conductors monitored by the current sensor 170. The current sensor 170 may generate control signals that are sent to the controller 150 to appropriately regulate the power provided to the motor.

The housing 160 generally secures each of the components discussed above in an integrated package, e.g., as a carrier for each of the components in a press-fit configuration. In one exemplary embodiment, the housing 160 may be plastic. Conventional electronic systems for such applications are formed by separate components, e.g., with minimal or no integration. In the depicted exemplary embodiment, each of the power module 110, capacitor assembly 140, and current sensor 170 are secured in the housing in individual sections or portions (e.g., sections 162, 164, 166) formed by interior walls of the housing 160. The remaining components, e.g., bus bar 120, are secured to the housing, and in effect, function to as a covering to further secure the power module 110, capacitor assembly 140, and current sensor 170. As noted above, the bus bar 120 and heat sink 114, as well as any other components, may be secured to the housing 160 with screws or other fasteners to provide the integrated unit. As shown, the housing 160 may have integrated attachment points to receive the screws or fasteners in the form of threaded holes or posts, e.g., screws 122 for the AC bus bar 120, screws 154 for the controller 150, and screws 134 for the DC bus bar 130.

In one exemplary embodiment, the AC bus bar 120, in effect, forms a portion of the housing in that the AC bus bar 120 is sized to cover section 166 of the housing 110. As shown, the AC bus bar 120 has a width and length (e.g., in the x and y directions) to cover the housing section 166 upon securement to the housing 160 via screws 122 or other fasteners. In this position, the AC bus bar 120 is also coupled to the power module 110 via pins 153 and is secured relative to the DC bus bar 130 with screws 126 or other fasteners within fastening holes adjacent to or forming part of housing section 166 for receiving the screws 126.

Similarly, the DC bus bar 130 may form a portion of the housing in that the DC bus bar 130 is sized to cover section 164 of the housing 110. As shown, the DC bus bar 130 has a width and length (e.g., in the x and y directions) to cover the housing section 164 upon securement to the housing 160 via screws 134 or other fasteners within fastening holes adjacent to or forming part of the housing section 164 for receiving the screws 134. In this position, the DC bus bar 130 is coupled to the capacitor assembly 140 via pins 142.

As also shown, the controller 150 is positioned above the AC bus bar 120, DC bus bar 130, and power module 110. In effect, the controller 150 and arrangement of bus bars 120, 130 function to cover housing section 162. The controller 150 is coupled to the power module 110 via pins 152 and to the housing via screws 154.

The power electronic building block 100 may have any suitable internal connections in addition to the bus bars 120, 130 discussed above. For example, interconnects, such as fully sintered interconnects may be provided between the heat sink 114 and the substrate of the power module 110 and/or the substrate and the die of the power module 110. Such sintered interconnects may be provided by powered metal pressed into a desired shape, and then sintered at an elevated temperature to provide the interconnect. Ribbon bond connections may be provided between the die and the ceramic substrate of the power module 110, which may be facilitated by the press-fit frame. Silver sinter joints may be provided between the heat sink 114 and ceramic substrate and/or the die of the power module 110.

As a result of this configuration, the power electronic building block 100 is both scalable and modular for both current and voltage. The power electronic building block 100 is modular in that one or more of the power electronic building blocks 100 may be combined as necessary or desired based on the application. For example, three of the power electronic building blocks 100 described above may be combined to form a three-phase inverter, and six of the power electronic building blocks 100 described above may be combined to form a dual three-phase inverter. Furthermore, in one exemplary embodiment, the various electrical components and the housing may be designed such that current and capacitance may be scaled (e.g., increased or decreased) by changing the dimensions of the power electronic building block 100 in one direction. For example, the current may be increased by increasing the width of the power module 110 in the x-direction, as shown in FIGS. 1 and 2. Similarly, the capacitance or voltage may be increased by increasing the width of the capacitor assembly 140 in the x-direction. As such, either or both parameters may be increased by expanding the power electronic building block 100 in a single direction while maintaining the other two dimensions. In one exemplary embodiment, the current may be scaled from about 230 A to about 450 A, the voltage may be scaled from about 400 V to about 700 V, and the capacitance may be scaled from about 75 µF to about 155 µF, e.g., by adjusting the thickness from about 3.0 µm to about 2.3 µm. Such arrangement may increase the ratio of power to volume. The power module 110 of the power electronic building block 100 may be configured as a wide band gap device (e.g., SiC, GaN) or Silicon depending on the application. The power electronic building block 100 may have an integrated gate drive (e.g., controller 150), capacitor assembly 140, and current sensor 170 with half bridge topology. As noted above, the power electronic building block 100 has an integrated AC bus bar 120 and an ultra-low DC bus bar 130 in a half bridge topology. The power module 110 may be connected to the controller 150, AC bus bar 120, and DC bus bar 130 with press-fit techniques.

Figure 4:
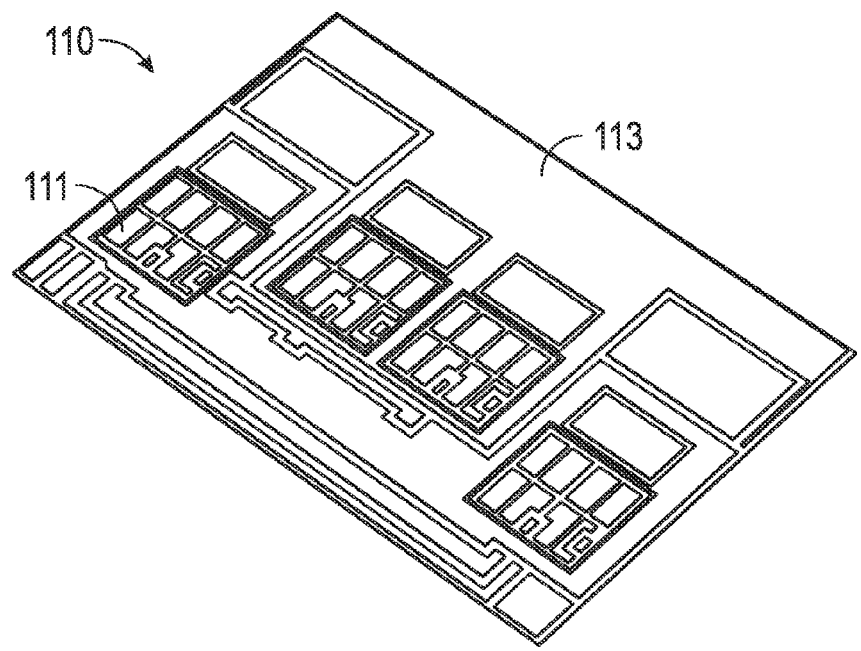
FIGS. 4-10 are views of the power electronic building block of FIG. 1 as the components are assembled in accordance with an exemplary embodiment.

FIGS. 4-10 are views of the power electronic building block 100 of FIG. 1 as the components are assembled in accordance with an exemplary embodiment. In particular, FIG. 4 depicts an isometric view of the power module 110, including the die 111 interconnected on the substrate 113.

Figure 5:
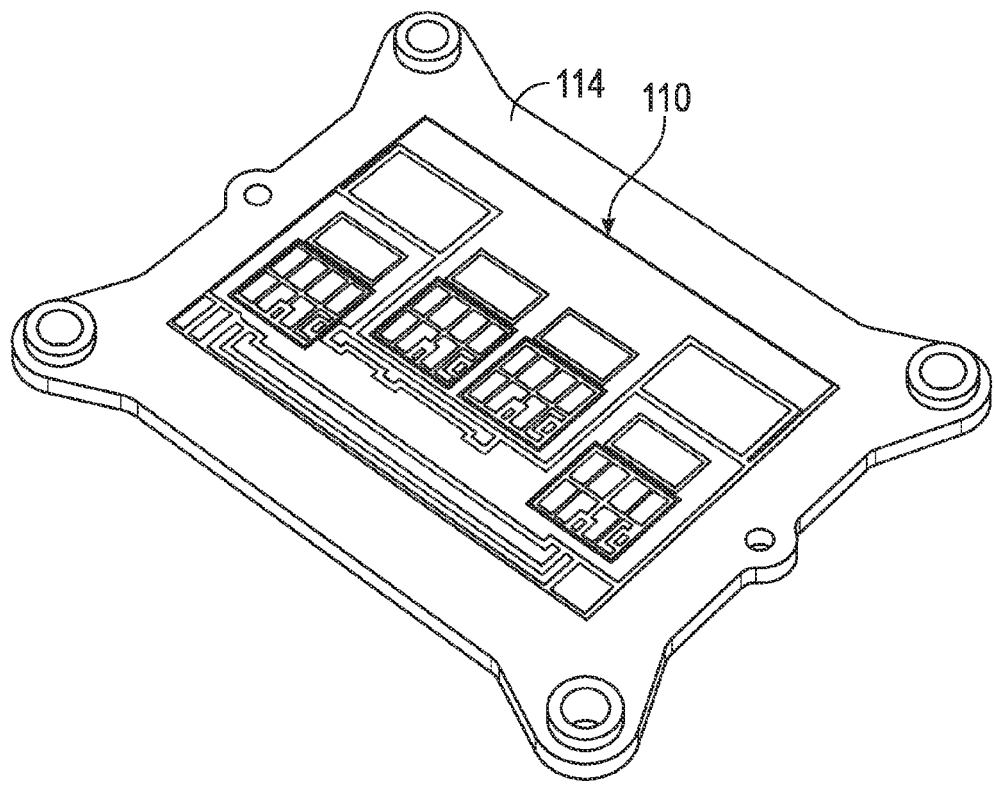

FIG. 5 depicts an isometric view of the power module 110 coupled to the heat sink 114. As noted above, the heat sink 114 has a number of attachment points to mount the heat sink 114 to the housing 160 and the controller 150.

Figure 6:
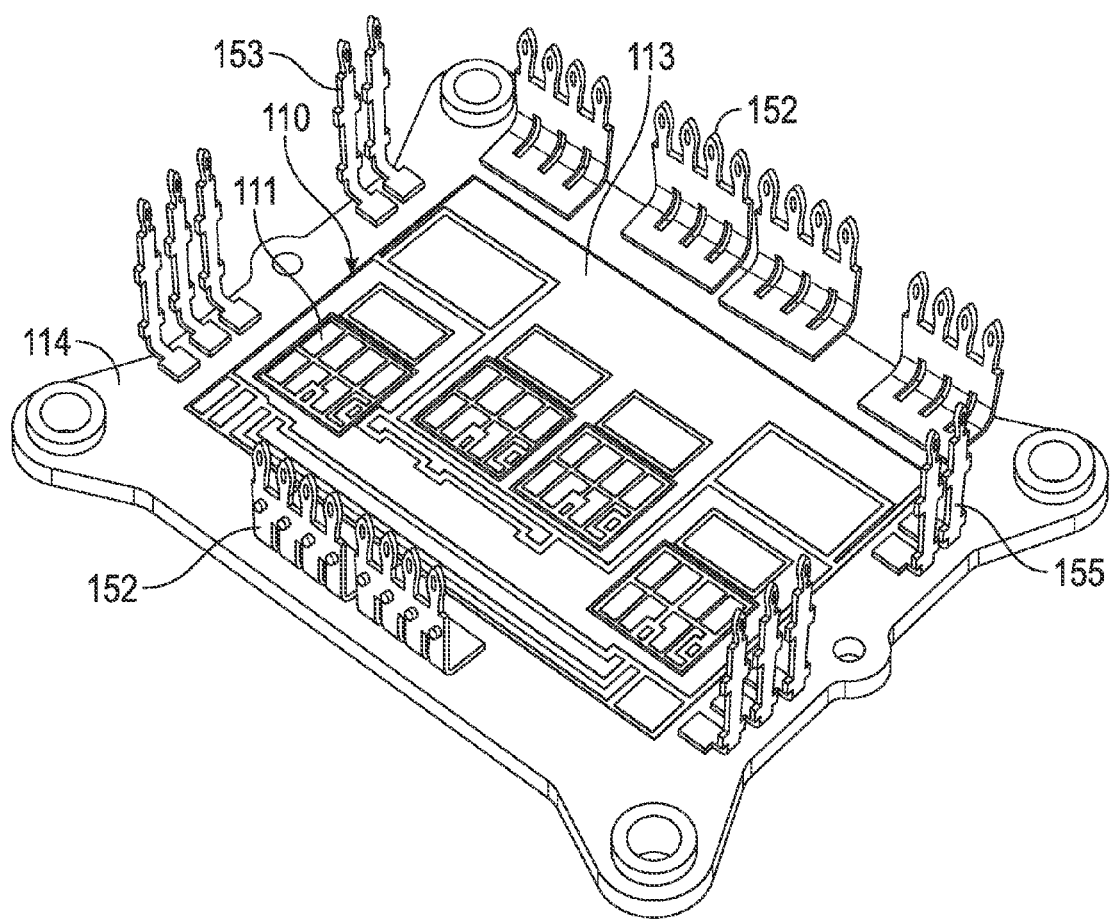

FIG. 6 depicts the pins 152 that, upon complete assembly couple the power module 110 to the controller 150 such that signals may be provided therebetween. FIG. 6 additionally depicts pins 153 and 155. Pins 153 couple the power module 110 to the AC bus bar 120, and pins 155 couple the power module 110 to the DC bus bar 130. In some embodiments, the die 111, substrate 113, heat sink 114, and pins 152, 153, and 155 may collectively be referred to as the power module 110.

Figure 7:
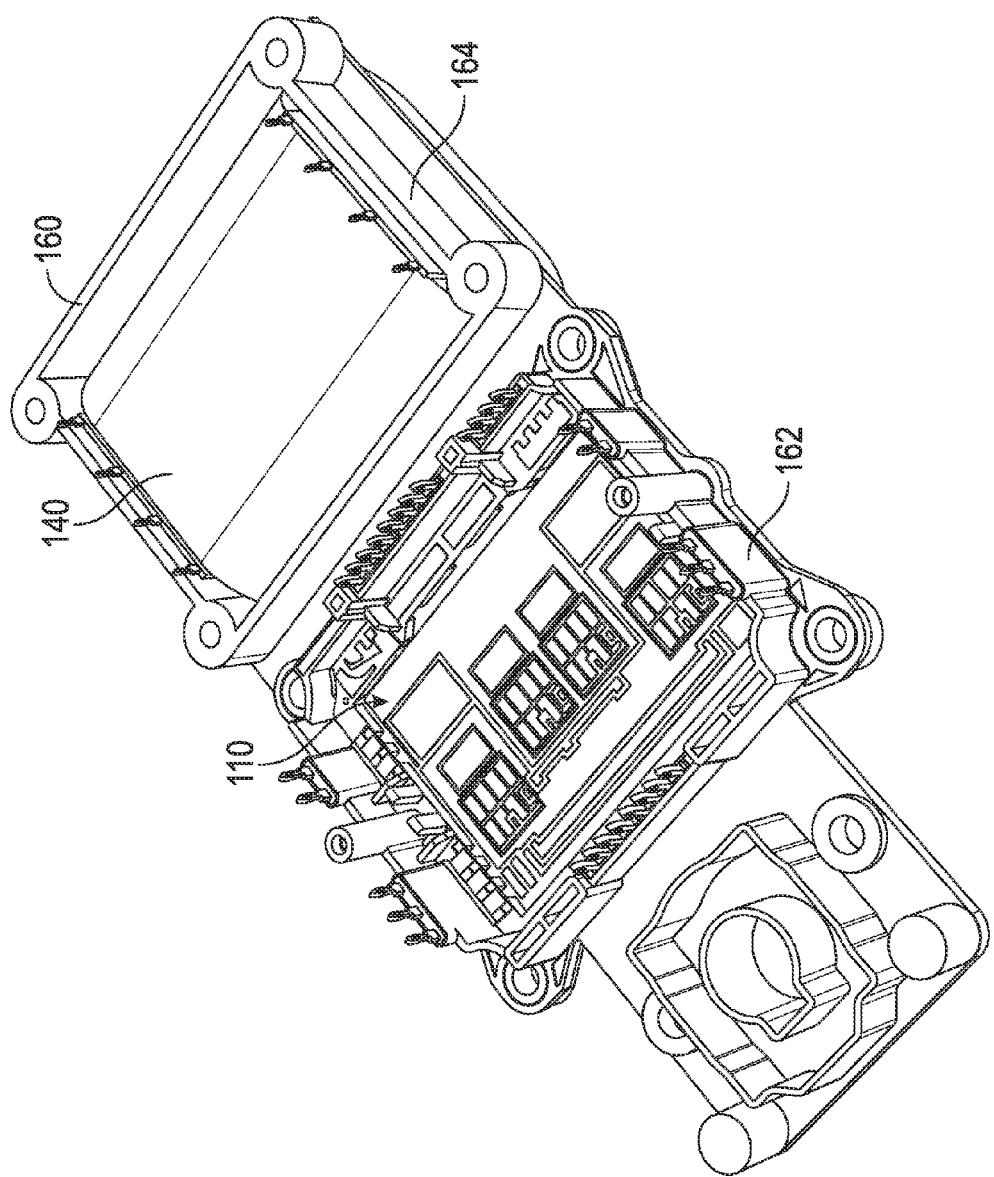

FIG. 7 depicts the power module 110 and capacitor assembly 140 mounted within the housing 160. As noted above, the power module 110 is mounted within section 162 and capacitor assembly 140 is mounted with section 164.

Figure 8:
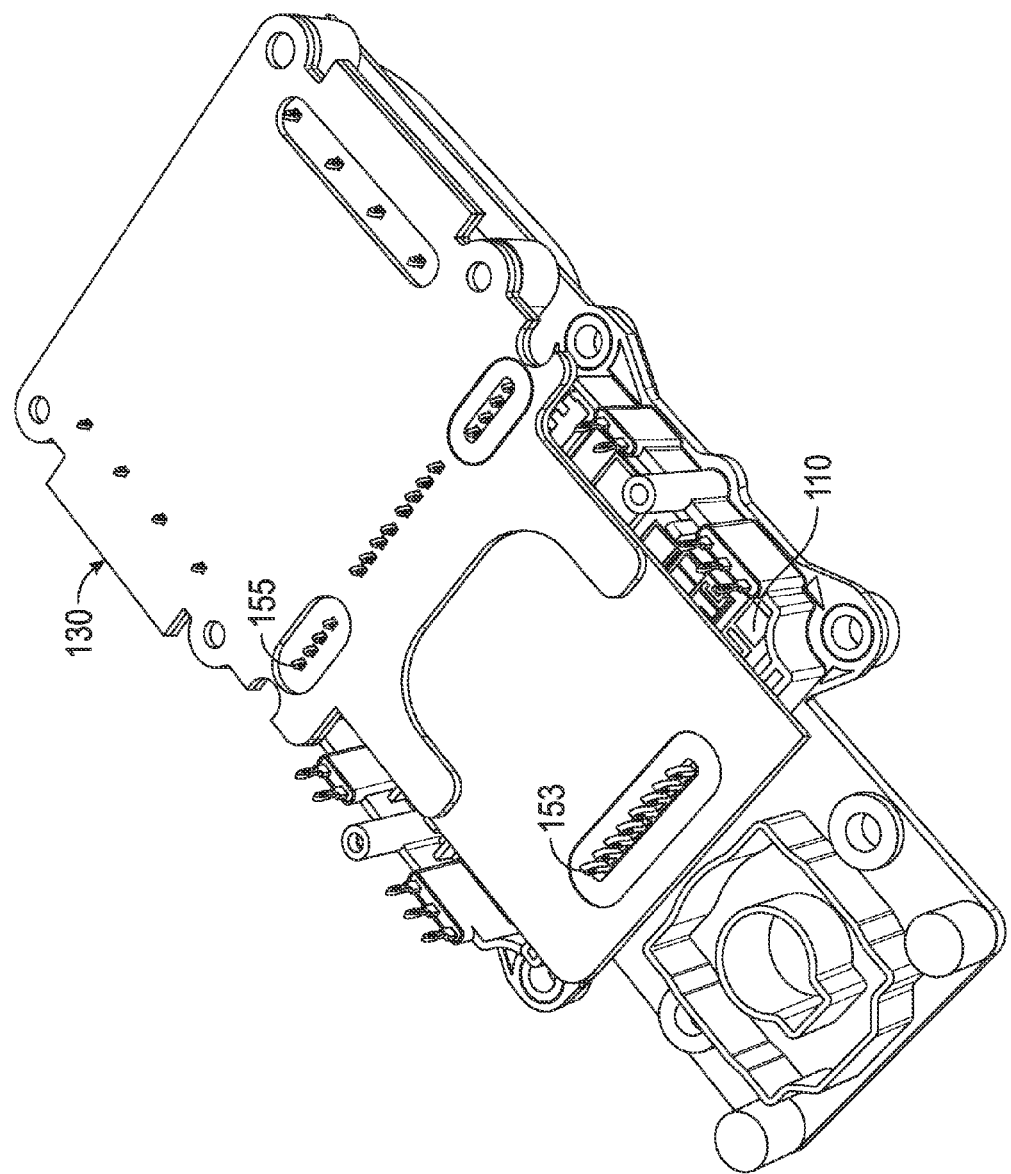

FIG. 8 depicts the DC bus bar 130 mounted within the power electronic building block 100. As noted above, the DC bus bar 130 is coupled to the power module 110 via pins 155, and as particularly shown in FIG. 8, the pins 153 to be coupled to the AC bus bar 120 are accommodated by an aperture in the DC bus bar, insulated from the AC signals.

Figure 9:
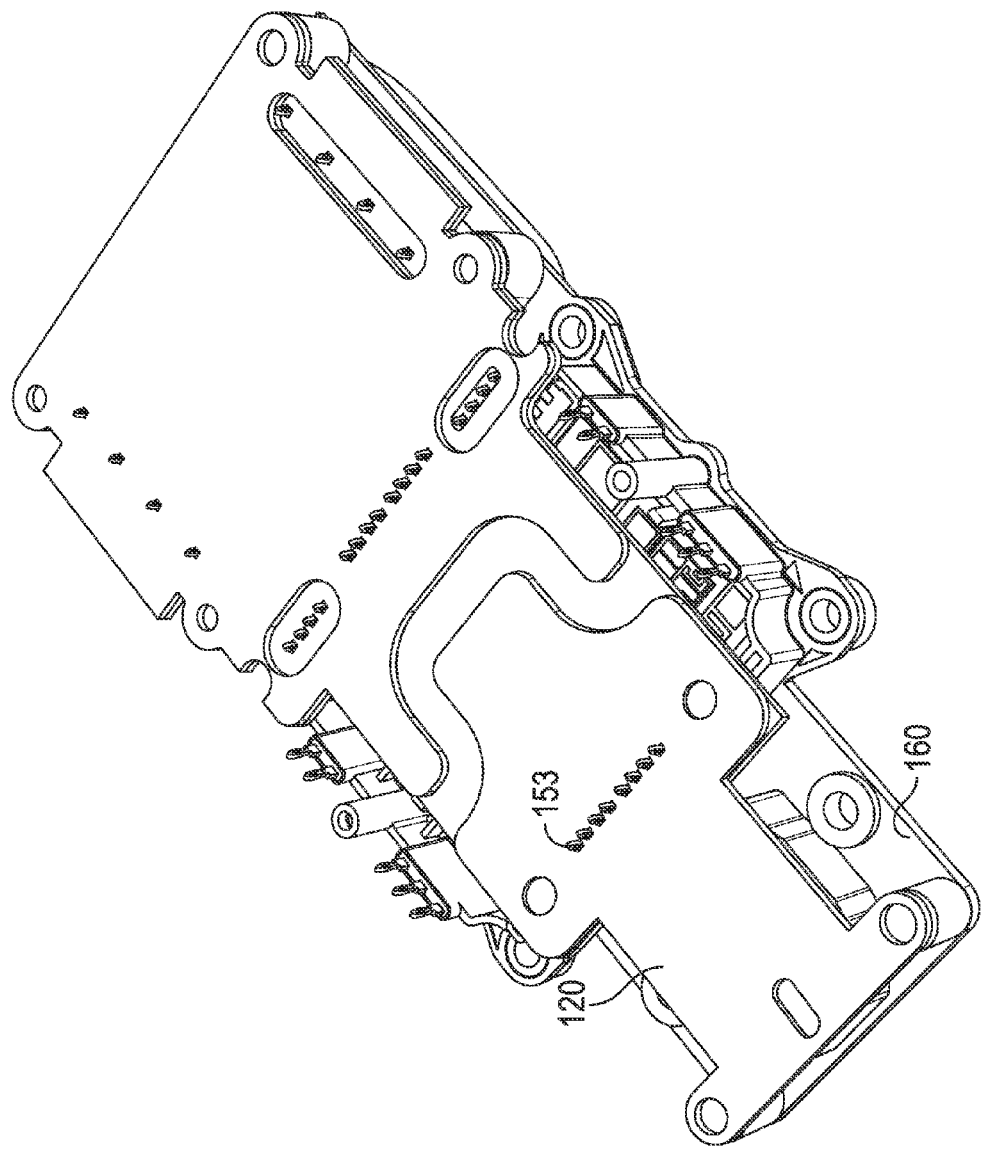

FIG. 9 depicts the AC bus bar 120 mounted within the power electronic building block 100 over a portion of the DC bus bar 130 and coupled to the pins 153. FIG. 9 also depicts the attachment points that secure the AC bus bar 120 to the housing 160.

Figure 10:
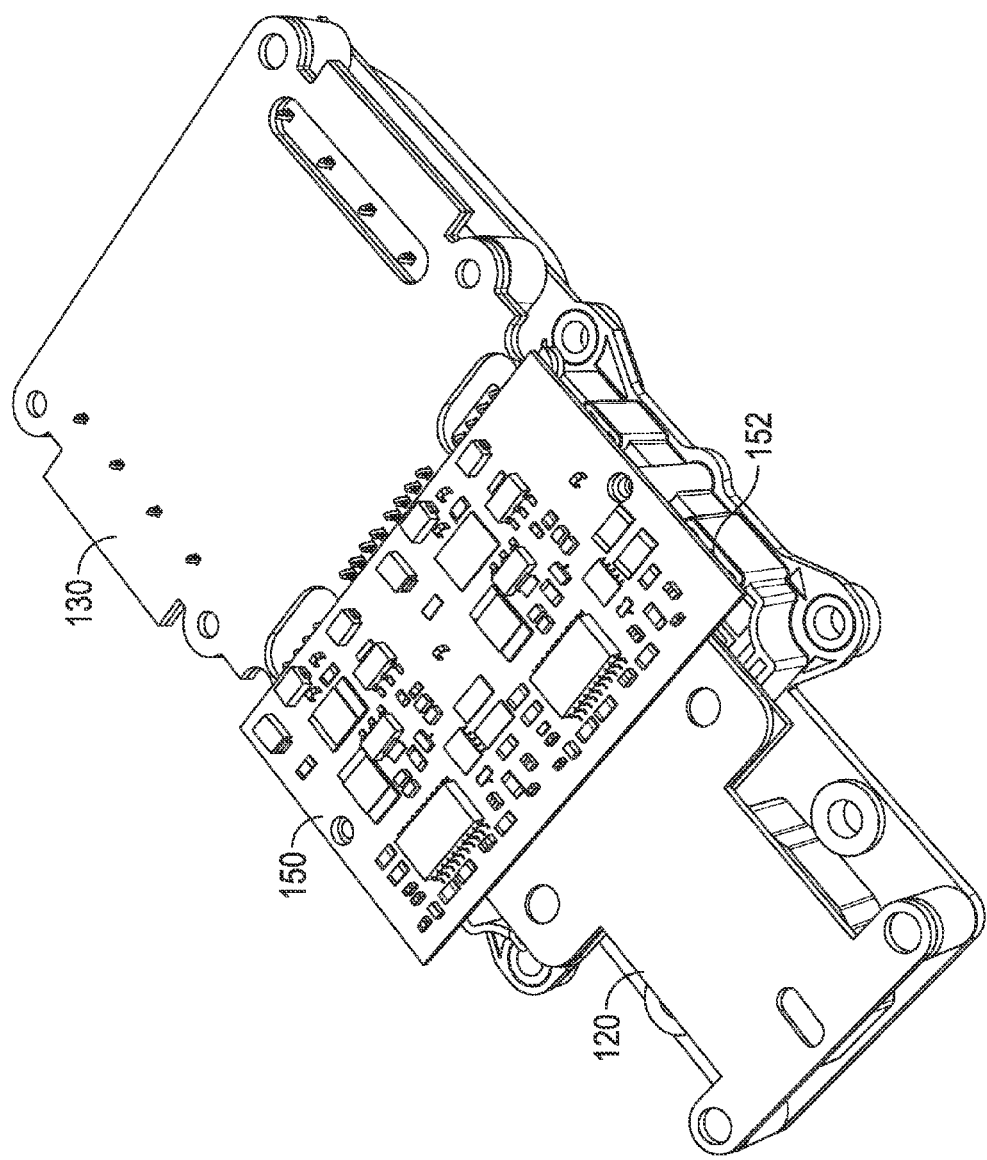

FIG. 10 depicts the controller 150 mounted within the power electronic building block 100 over portions of the DC bus bar 130 and AC bus bar 120. As noted above, the controller 150 is coupled to the power module 110 via pins 152. The completed power electronic building block 100 is depicted in FIG. 1, including the screws and other securements that secure together the power electronic building blow.

The power electronic building block 100 may be used in high power and high temperature applications. During production, the same production line and assembly processes may be used for all variations of the power electronic building blocks 100 discussed above.

As noted above, one or more of the power electronic building blocks 100 may form a power inverter module and power converter modules used in hybrid, plug-in hybrid, fuel cell, electric, extended range electric vehicles and other types of vehicles, as well as non-automotive applications in a scalable and modular design. Such design approaches enable consistent mechanical, thermal, and electrical performance characteristics across a wide variety of power modules and electronic components. For example, the power electronic building blocks 100 may have the same failure modes for all modules and all vehicles, fewer number of component validations, and more content validation at key component level. With such design characteristics, the power electronic building block 100 may provide a relatively simple solution at reduced cost and increased flexibility across multiple platforms or applications.

Figure 11:
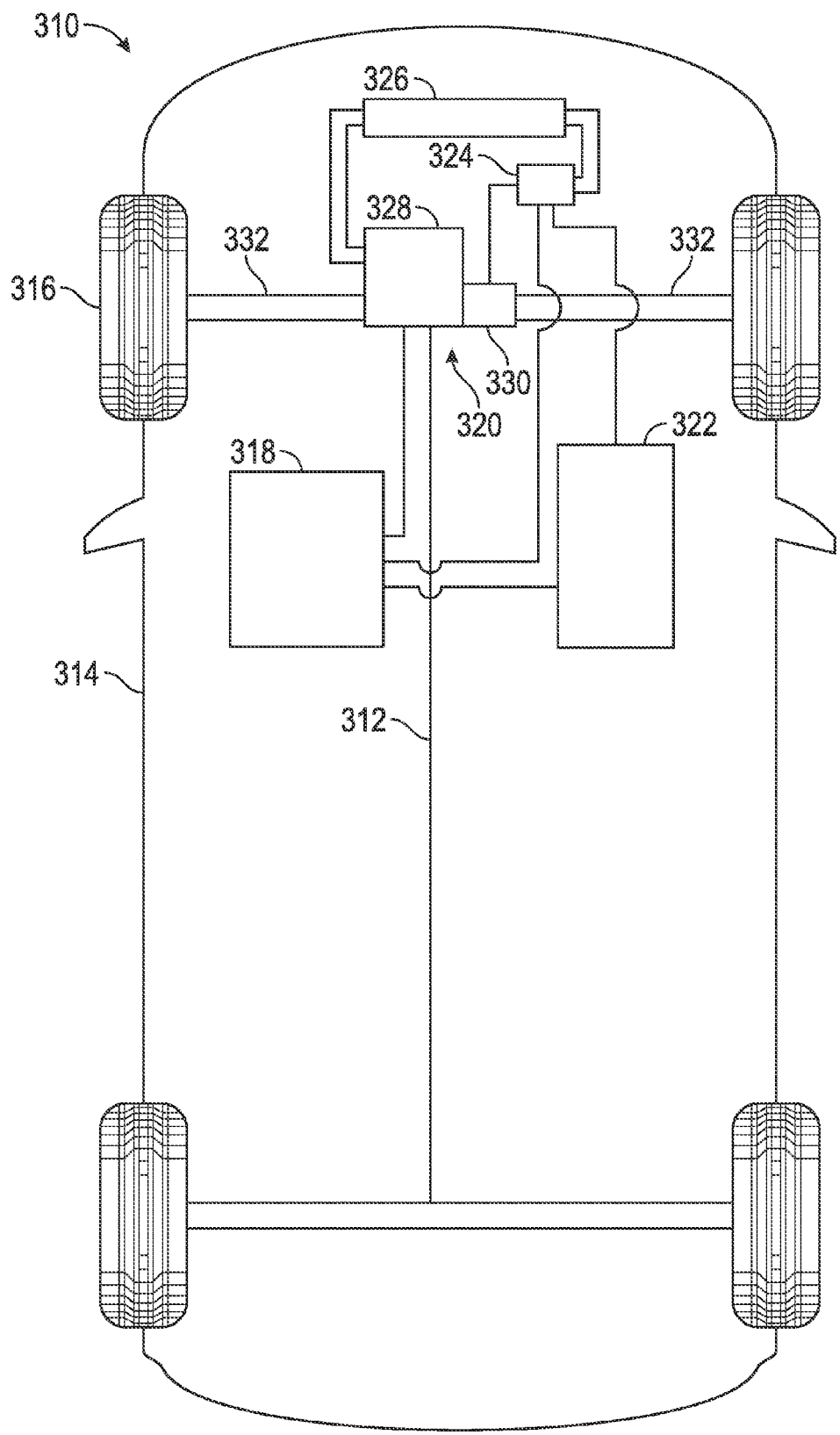
FIG. 11 is a vehicle with the power electronic building block of FIG. 1 in accordance with an embodiment.

As noted above, one or more of the power electronic building blocks 100 may be combined to form a power converter assembly, such as those used in automotive applications. FIG. 11 is one exemplary implementation of the power electronic building blocks 100 discussed above.

FIG. 11 illustrates a vehicle (or "automobile") 310, according to one embodiment of the present invention. The automobile 310 includes a chassis 312, a body 314, four wheels 316, and an electronic control system 318. The body 314 is arranged on the chassis 312 and substantially encloses the other components of the automobile 310. The body 314 and the chassis 312 may jointly form a frame. The wheels 316 are each rotationally coupled to the chassis 312 near a respective corner of the body 314.

As introduced above, the automobile 310 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The automobile 310 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 11, the automobile 310 is a hybrid vehicle, and further includes an actuator assembly 320, a battery (or a high voltage direct current (DC) power supply) 322, a power converter assembly (e.g., an inverter assembly) 324, and a radiator 326. The actuator assembly 320 includes a combustion engine 328 and an electric motor/generator (or motor) 330. As will be appreciated by one skilled in the art, the electric motor 330 includes a transmission therein, and although not illustrated also includes a stator assembly (including conductive coils), a rotor assembly (including a ferromagnetic core), and a cooling fluid (i.e., coolant). The stator assembly and/or the rotor assembly within the electric motor 330 may include multiple electromagnetic poles (e.g., sixteen poles), as is commonly understood.

Still referring to FIG. 11, in one embodiment, the combustion engine 328 and the electric motor 330 are integrated such that both are mechanically coupled to at least some of the wheels 316 through one or more drive shafts 332. The radiator 326 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the engine 328 and the power converter assembly 324, which may be a direct current-to-alternating current (DC/AC) inverter (i.e., a DC-to-AC inverter) in one exemplary embodiment or a direct current-to-direct current (DC/DC) converter, as alternate example. As noted above, the power converter assembly 324 may be formed by one or more of the power electronic building blocks 100 discussed above.

During operation, the automobile 310 is operated by providing power to the wheels 316 with the combustion engine 328 and the electric motor 330 in an alternating manner and/or with the combustion engine 328 and the electric motor 330 simultaneously. In order to power the electric motor 330, DC power is provided from the battery 322 (and, in the case of a fuel cell automobile, a fuel cell) to the power converter assembly 324, which converts the DC power into AC power, before the power is sent to the electric motor 330.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A power electronic building block, comprising:
    a housing having a base and walls extending generally perpendicularly from the base, the walls including a first set of walls enclosing a first section on the base of the housing and a second set of walls enclosing a second section on the base of the housing, the first set of walls being laterally offset from the second set of walls on the base;
    a power module mounted on the base within the first section of the housing;
    a controller mounted within the housing and coupled to the power module;
    a capacitor assembly coupled to the power module and mounted on the base within the second section of the housing;
    an AC bus bar mounted within the housing; and
    a DC bus bar coupling the capacitor assembly to the power module and mounted within the housing.

2. The power electronic building block of claim 1, further comprising a heat sink mounted to an underside of the power module.

3. The power electronic building block of claim 2, wherein the heat sink is mounted on the housing.

4. The power electronic building block of claim 3, wherein the heat sink has a first side with a generally planar surface and a second side with pins, and wherein the housing defines an opening such that the first side of the heat sink covers the opening and contacts the power module and the pins extend away from the housing.

5. The power electronic building block of claim 4, further comprising fully sintered interconnects between the heat sink and the power module.

6. The power electronic building block of claim 1, further comprising a current sensor configured to monitor current from the power module and to generate control signals for the controller.

7. The power electronic building block of claim 6, wherein the current sensor is housed within the housing.

8. The power electronic building block of claim 1, wherein the DC bus bar is positioned over the capacitor assembly to cover the second section and positioned over the power module to at least partially cover the first section.

9. The power electronic building block of claim 8, wherein the second section includes a first set of fastening holes and wherein the DC bus bar is secured to the housing via a first set of fasteners extending through the DC bus bar into the first set of fastening holes.

10. A power electronic building block, comprising:
    a housing;
    a power module mounted within the housing;
    a controller mounted within the housing and coupled to the power module;
    a capacitor assembly coupled to the power module and mounted within the housing;
    an AC bus bar mounted within the housing; and
    a DC bus bar coupling the capacitor assembly to the power module and mounted within the housing,
    wherein the housing has a base and walls extending generally perpendicularly from the base, wherein the power module and the capacitor assembly are arranged on the base of the housing, and wherein the walls form a first section surrounding the power module and a second section surrounding the capacitor assembly,
    wherein the DC bus bar is positioned over the capacitor assembly to cover the second section and positioned over the power module to at least partially cover the first section, wherein the second section includes a first set of fastening holes, and wherein the DC bus bar is secured to the housing via a first set of fasteners extending through the DC bus bar into the first set of fastening holes, and
    wherein the AC bus bar is positioned over the first section to cover the power module and at least a portion of the DC bus bar.

11. The power electronic building block of claim 10, wherein the first section includes a second set of fastening holes, and wherein the AC bus bar is secured to the housing via a second set of fasteners extending through the AC bus bar into the second set of fastening holes.

12. The power electronic building block of claim 11, wherein the housing further defines a third section, wherein the power electronic building block further comprises a hall effect sensor arranged in the third section, and wherein the AC bus bar covers the third section and the hall effect sensor.

13. The power electronic building block of claim 12, wherein the controller is positioned over at least portions of the AC bus bar, the DC bus bar, and the power module.

14. The power electronic building block of claim 13, wherein the housing includes a third set of fastening holes, and wherein the controller is secured to the housing via a third set of fasteners extending through the controller into the third set of fastening holes.

15. A method for forming a power electronic building block, comprising the steps of:
- positioning, via press fitting, a power module within a first section of a housing;
- positioning, via press fitting, a capacitor assembly within a second section of the housing;
- positioning, via press fitting, a current sensor within a third section of the housing;
- mounting a DC bus bar on the housing over the first section and the second section and coupling the DC bus bar to the power module and the capacitor assembly via press fitting;
- mounting an AC bus bar on the housing over the second section and over the third section and the current sensor and coupling the AC bus bar to the power module via press fitting; and
- mounting a controller over at least portions of the power module, the DC bus bar, and the AC bus bar.

16. The method of claim 15, further comprising the step of:
attaching the DC bus bar, the AC bus bar, and the controller to the housing via fasteners.

\* \* \* \* \*

UNITED STATES PATENT AND TRADEMARK OFFICE
CERTIFICATE OF CORRECTION

| | | |
|---|---|---|
| PATENT NO. | : 9,295,184 B2 | Page 1 of 1 |
| APPLICATION NO. | : 14/094066 | |
| DATED | : March 22, 2016 | |
| INVENTOR(S) | : Mark D. Korich | |

It is certified that error appears in the above-identified patent and that said Letters Patent is hereby corrected as shown below:

In the Specification

Column 1, line 6, please add the following paragraph between the Title and Technical Field:

--STATEMENT REGARDING FEDERALLY SPONSORED RESEARCH OR DEVELOPMENT

This invention was made with Government support under Government Program No. DE-EE0005572 awarded by the United States Department of Energy. The government has certain rights in this invention.--

Signed and Sealed this
Seventh Day of June, 2016

Michelle K. Lee
*Director of the United States Patent and Trademark Office*